United States Patent [19]
Bracher

[11] Patent Number: 5,490,915
[45] Date of Patent: Feb. 13, 1996

[54] TARGET FOR CATHODE SPUTTERING APPARATUS

[75] Inventor: Bernhard Bracher, Balzers, Germany

[73] Assignee: Balzers AG, Balzers, Liechtenstein

[21] Appl. No.: 260,538

[22] Filed: Jun. 16, 1994

[30] Foreign Application Priority Data

Jul. 15, 1993 [DE] Germany .............. 9310565 U

[51] Int. Cl.⁶ .................................. C23C 14/35
[52] U.S. Cl. .................. 204/298.18; 204/298.12
[58] Field of Search ............ 204/298.12, 298.16, 204/298.17, 298.18

[56] References Cited

U.S. PATENT DOCUMENTS

| | | | |
|---|---|---|---|
| 4,957,605 | 9/1990 | Hurwitt et al. | 204/192.12 |
| 5,133,850 | 7/1992 | Kukla et al. | 204/298.12 |
| 5,174,875 | 12/1992 | Hurwitt et al. | 204/192.12 |

Primary Examiner—Aaron Weisstuch
Attorney, Agent, or Firm—Notaro & Michalos

[57] ABSTRACT

A sputtering target, magnetron sputtering source using the sputtering target, and vacuum coating apparatus using the magnetron source, wherein the performance of the target is improved by providing a concave ring shaped sputtering surface on the target which is continuously curved between an inner rim area and an outer rim area of the target.

2 Claims, 2 Drawing Sheets

TARGET FOR CATHODE SPUTTERING APPARATUS

FIELD AND BACKGROUND OF THE INVENTION

The present invention relates to a sputtering target in the form of a ring and including a ring shaped concave sputtering surface lying between an inner and outer rim of a target area.

Ring shaped targets consist of the material to be sputtered within a cathode sputtering apparatus, for depositing a layer on substrate surfaces in the apparatus. The layer consists of the target material or, in the case where a chemically active gas is present in the sputtering apparatus, a chemical compound consisting of elements of the target material and of the active gas is deposited as the layer. Such targets are used in sputtering sources and especially in magnetic field supported sputtering sources, such as magnetrons. Ring shaped targets are especially suited for applications where the substrate to be sputtered is placed statically in front of the sputtering source and where a homogeneous coating is to be deposited. Ring shaped arrangements also allow the use of especially thick targets as the necessary constructive measures so that ring shaped arrangements for the generation of suitable magnetic field configurations can be realized more easily. Magnetic poles and magnetic field generating devices, for instance, can be placed easily on the inner and outer sides of the ring shaped targets, as there is a hollow space within the central area of the ring target which can be used for such structures. The central area of the usual planar target, however, is not available for this purpose.

A known cathode sputtering device with a ring target is, for instance, described in the German Patent Specification DE 40 42 286. To reach long operating hours for the sputtering device, thick targets are preferred. With thick targets, however, there is the problem that the continuing erosion strongly changes the target surface due to the progressing erosion of the target which leads to a different operating behavior. Problems can arise due to the fact that, after a certain period, the surface is no longer evenly sputtered at various positions of the eroded target. There can even be a redeposition of the sputtered target material which then leads to an unwanted layer on the target surface. The unwanted layer can lead to chip-offs which can make the coated substrate unusable. Other possible problems are contamination or instabilities with arcing during the sputtering operation. This can even lead to a breakdown of the entire sputtering apparatus. The problem is partly solved by laterally lifting the poles as described in German Patent Specification DE 40 42 286. Up to a certain degree, this also optimizes target utilization. Another measure to solve these problems is suggested in this German Patent Specification. It consists of giving the sputtering surface a certain form. The main part is formed as a flat recess enclosed by two concentric prominences whose walls stand at a preset angle, ranging between 30 to 70 grades. This measure prevents the deposition of the target material on the wall surfaces of the target prominences and at the same time it maintains the advantages of the hollow magnetron, i.e. the high utilization rate of the target material. With this construction it was found that the redeposition on the lateral wall surfaces cannot be completely prevented on the whole of the sputtering surface during the entire target lifetime. In addition, with this construction the utilization rate of the target was restricted to a certain maximum value. The target also could only be used with a sufficient operating safety as long as no important redepositions took place or as long as the layer was not damaged by chip-offs. This, in addition, restricted the utilization rate of the device.

SUMMARY OF THE INVENTION

The aim of the present invention is to eliminate these disadvantages in the state of the art. The present invention is mainly intended to present a ring target for cathode sputtering which prevents a redeposition onto the sputtering surface, with target material, during the sputtering operation. This is mainly intended to be ensured during the entire target life-time, with at least the present target utilization rate, or even a higher target utilization rate.

The task of the invention is solved with a ring shaped target which has a concave ring shaped sputtering surface lying between an inner target rim area of the target, and an outer target rim area. The concave sputtering surface has a cross-section which is in the form of a curve that is continuous in the interval between the inner and outer target rim areas.

The advantage of the invention, compared to the state of the art, consists mainly in reaching an important increase in security against the danger of contamination. The main advantage is that there is no redeposition of target material on the entire deposition surface. This results in a drastic decrease in the arcing frequency, which leads to considerably more stable operating behavior. The first ignition of a discharge after a target change is no problem, i.e. full performance can be reached immediately. A slow start is no longer necessary. The target utilization can also be increased easily by several percent. The production of the target according to the present invention, in addition, is much simplified and thus more economical.

A further object of the present invention is to provide a sputtering target design which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

The invention is now described by means of the drawings, wherein.

DESCRIPTION OF THE PREFERRED EMBODIMENTS

Figure 1:
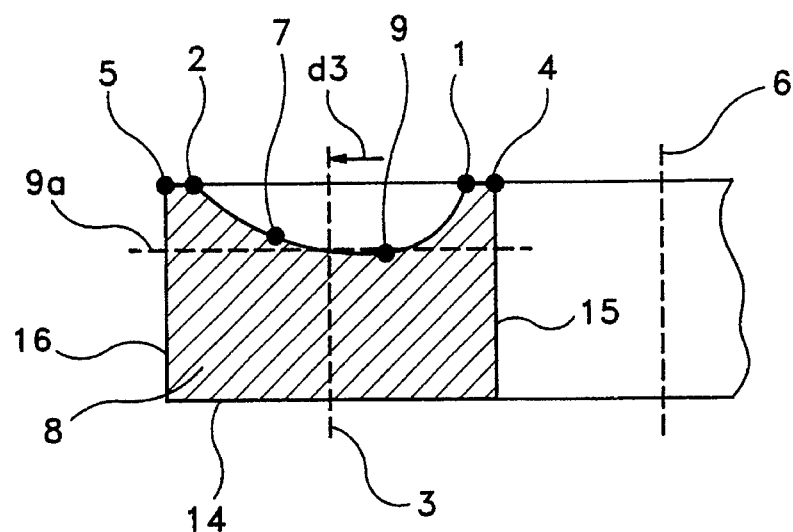
FIG. 1 is a sectional view of a ring target according to the invention, where inner and outer target rim areas lay on the same level.
Figure 1A:
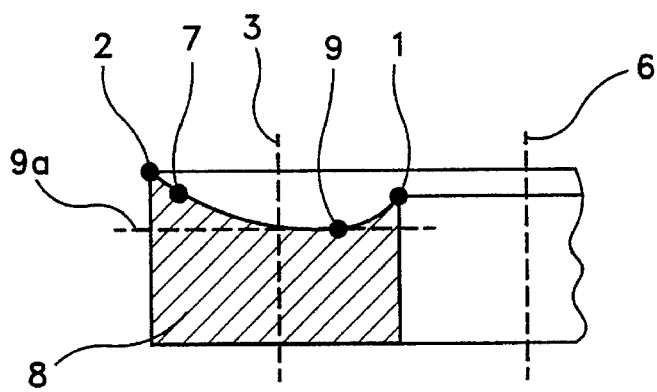
FIG. 1a is a sectional view of a ring target according to the invention where the inner target rim is lower compared to the outer target rim.

FIG. 1 is a sectional view of a ring shaped target, where only one side of the target section is shown. A target body 8 is embraced by lateral inner and outer surfaces 15 and 16, respectively, a backside 14 and a sputtering surface 7 which forms a curve in the sectional view, as well as prominences or projections at inner and outer target rim areas 1, 4 and 2, 5, respectively. In the axial center of the ring shaped target body 8, a central target axis 6 is shown. The concave recess of the sputtering surface 7 according to the invention, forms a continuous curve. It becomes apparent that any kind of edges within the sputtering zone, are unsuitable. The continuous curve can be optimized by simple experiments with respect to the form of the target, or to the target dimensions respectively, or the construction of the sputtering source arrangement. The line of the curve in surface 7, as well as the depth 9a of the curve, from its lowest point 9, results from these experiments. The target can be fitted with a sputtering surface 7 which is embraced by the sputtering surface rims 1, 2, where these rims 1, 2 are not necessarily target rim areas 4, 5. Rim areas 4, 5 can be used, and may form prominences or target rim areas which can be several millimeters wide, for example 3 mm wide. Depending on the design, the rim prominences 1, 4 and 5, 2 can remain but they may also merge into each other as shown in FIG. 1a. It is most favorable if the curve of surface 7 has a maximal depth 9a that is related to the target rim area 1, 4; 2, 5, within 3 through 20% of the average diameter 3 of the ring shaped sputtering surface 7.

Figure 1B:
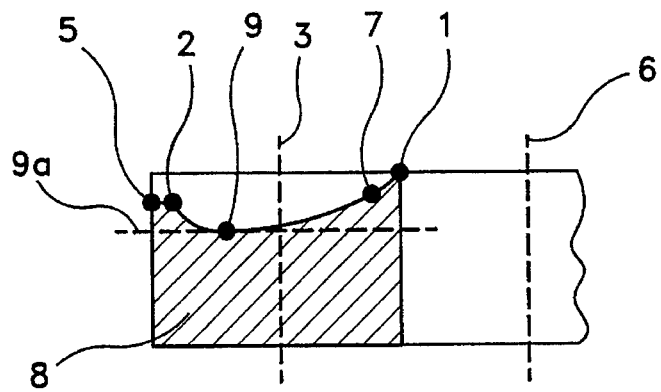
FIG. 1b is a sectional view of a target according to the invention where the outer target rim is lower compared to the inner target rim.

FIG. 1a and 1b, for instance, show, in a sectional view, how one of the concentrically positioned target rims can be lowered relative to the other one. The choice of how much the rim is lowered depends on the design of the magnetron sputtering source and the shape of its magnetic field lines, on the one hand, and on the sputtering characteristics on the other hand. It is noted that in all the drawings, the same numbers are used to designate the same, or functionally similar parts. The sputtering surface 7 with its rims 1, 2 can either coincide with one of the target rims 4, 5, or with both rims. This also depends on the practical realization of the arrangement. The lowering of one of the two rims preferably lies in a range of up to 6% of the average diameter 3 of the ring shaped sputtering surface. The inner target rim area 1, 4 is preferably lowered in order to cause a homogeneous distribution characteristic.

Figure 2:
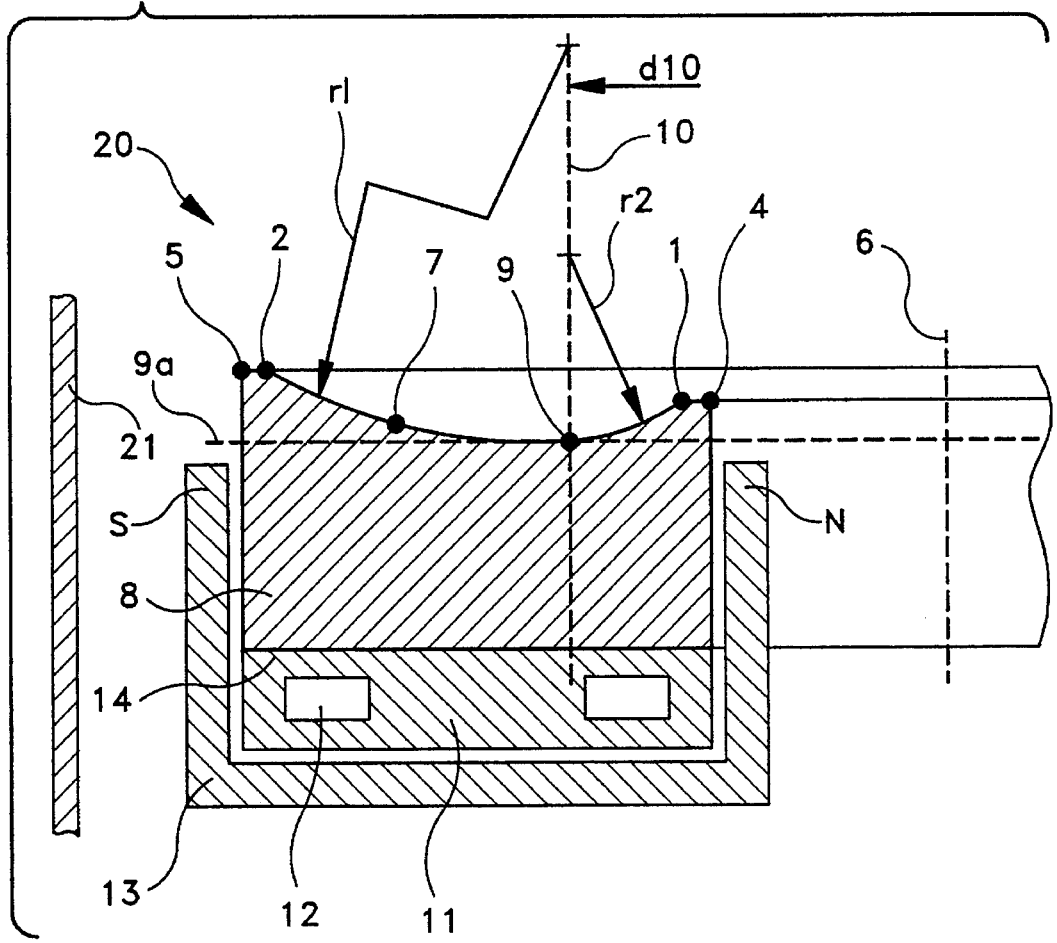
FIG. 2 is a sectional view of an approximately actual size target according to the invention, and a schematic representation of this target being integrated into a sputtering source arrangement.

FIG. 2, where the same reference numerals are used to designate the same or functionally similar parts, shows an example of a real target where the target body 8 is depicted approximately actual size and it schematically illustrates how this target is integrated in a sputtering source arrangement. The target body 8 is mounted on a cooling plate 11 with cooling channels 12. It is laterally encircled by an arrangement of magnets 13 of alternating polarity. It is known that there are several ways to realize the pole arrangement. Depending on the magnetic field lines desired, the magnets may be more or less pushed forward in the direction of the sputtering surface 7. The depicted target 8 is, for instance, most easily manufactured if the sputtering surface 7 is, in its cross section, made of circle segments, especially two circle segments, where one segment reaches from the rim 2 of the sputtering surface, through to the lowest point 9, and the second circle segment reaches from the lowest point 9, through to the inner sputtering surface rim 1. Preferably the lowest point of the curve 9 related to the average diameter 3, lies on a diameter 10 which is up to 40% smaller than the average diameter (3 in FIG. 1) of the ring. The approximated circle segments preferably have their centers on the same line 10 which is essentially parallel to the central axis 6 and at the same time, stands vertically on the target ring surface 7, and also runs through the lowest point 9. An especially suited target for instance, has an outer target diameter of 170 mm, and an inner target diameter of 56 mm and it is 37.5 mm thick; the inner diameter of the sputtering surface rim 1 measuring 62 mm and the outer diameter of rim 2 of the sputtering surface measuring 64 mm. The same line 10, for the center of the radii $R_1$ and $R_2$, lies on the diameter of 90 mm where radius $R_1$ is 80 mm and radius $R_2$ is 22.5 mm. This example of the target is preferably used with metal sputtering, especially of aluminum and its alloys. This curve of surface 7 is particularly suited by taking into account the sputtering characteristics of aluminum together with the corresponding design of the sputtering source. This leads to very good results with respect to operational safety and target life time.

FIG. 2 also schematically illustrates a vacuum coating apparatus using the target and comprising a vacuum chamber wall 21 for defining a vacuum chamber 20 for practicing a vacuum coating operation.

Figure 3:
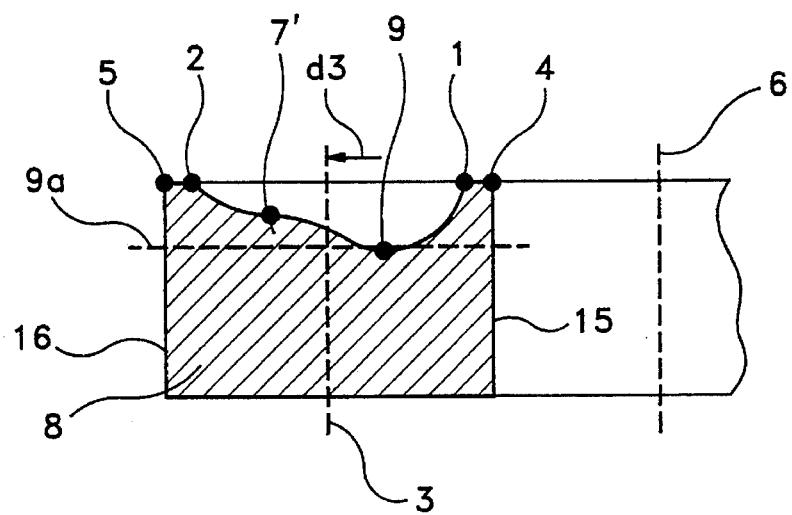
FIG. 3 is a view similar to FIG. 1 showing another embodiment of the invention with a substantially concave continuous curve which, nevertheless, includes a slight bump.

FIG. 3 shows another embodiment of the invention where the substantially concave and continuous curved surface 7' has a bump or rise within its confines between the rims 1 and 2.

While specific embodiments of the invention have been shown and described in detail to illustrate the application of the principles of the invention, it will be understood that the invention may be embodied otherwise without departing from such principles.

What is claimed is:

1. A sputtering target comprising:

a ring shaped body made of a metal selected from the group consisting of aluminum and aluminum alloy, the body having a target surface with an inner target rim, an outer target rim, and a ring shaped curved and substantially concave sputtering surface between the linear and outer target rims, the curved substantially concave sputtering surface having a cross-sectional shape which is curved and edge-free, within an interval between the linear and outer target rims, the curvature of the concave sputtering surface being selected to substantially avoid all growing of layers and redeposition of material sputtered from the sputtering target, back onto the target surface;

the inner target rim being lower than the outer target rim;

said concave sputtering surface includes a lowest point with respect to the higher one of the inner and outer target rims, the lowest point having a given depth below the higher outer target rim, and the lower inner target rim, the sputtering surface having an average diameter between the inner and outer target rims, the depth being about 3 to about 20% of the average diameter and the lower inner target rim being lower than the outer target rim by about up to 6% of the average diameter; and the lowest point being on a low point diameter which is up to about 40 percent smaller than the average diameter, the concave sputtering surface having a curvature which is substantially in the form of an outer circle segment between the lowest point and the outer target rim, and an inner circle segment between the lowest point and the inner target rim, the inner and outer circle segments having respective first and second radii each including a center, the center of each of the first and second radii lying on a common line which extends through the low point diameter, the sputtering target having a central axis, the common line extending substantially parallel to the central axis.

2. A vacuum coating apparatus comprising:

a vacuum coating chamber for receiving a vacuum to perform a vacuum coating operation;

a sputtering target including a ring shaped body made of a metal selected from the group consisting of aluminum and aluminum alloy, the body having a target surface with an inner target rim, an outer target rim, and a ring shaped curved and substantially concave sputtering surface between the linear and outer target rims;

the curved substantially concave sputtering surface having a cross-sectional shape which is curved and edge-free, within an interval between the linear and outer target rims, the curvature of the concave sputtering surface being selected to substantially avoid all growing of layers and redeposition of material sputtered from the sputtering target, back onto the target surface;

the inner target rim being lower than the outer target rim;

said concave sputtering surface includes a lowest point with respect to the higher one of the inner and outer target rims, the lowest point having a given depth below the higher outer target rim, and the lower inner target rim, the sputtering surface having an average diameter between the inner and outer target rims, the depth being about 3 to about 20% of the average diameter and the lower inner target rim being lower than the outer target rim by about up to 6% of the average diameter;

the lowest point being on a low point diameter which is up to about 40 percent smaller than the average diameter, the concave sputtering surface having a curvature which is substantially in the form of an outer circle segment between the lowest point and the outer target rim, and an inner circle segment between the lowest point and the inner target rim, the inner and outer circle segments having respective first and second radii each including a center, the center of each of the first and second radii lying on a common line which extends through the low point diameter, the sputtering target having a central axis, the common line extending substantially parallel to the central axis; and magnetic field generating means for generating a magnetic field, said magnetic field generating means having inner and outer poles which extend from a back side surface of the body, along respective inner and outer lateral target surfaces and toward the sputtering surface.

* * * * *